Figure 5:
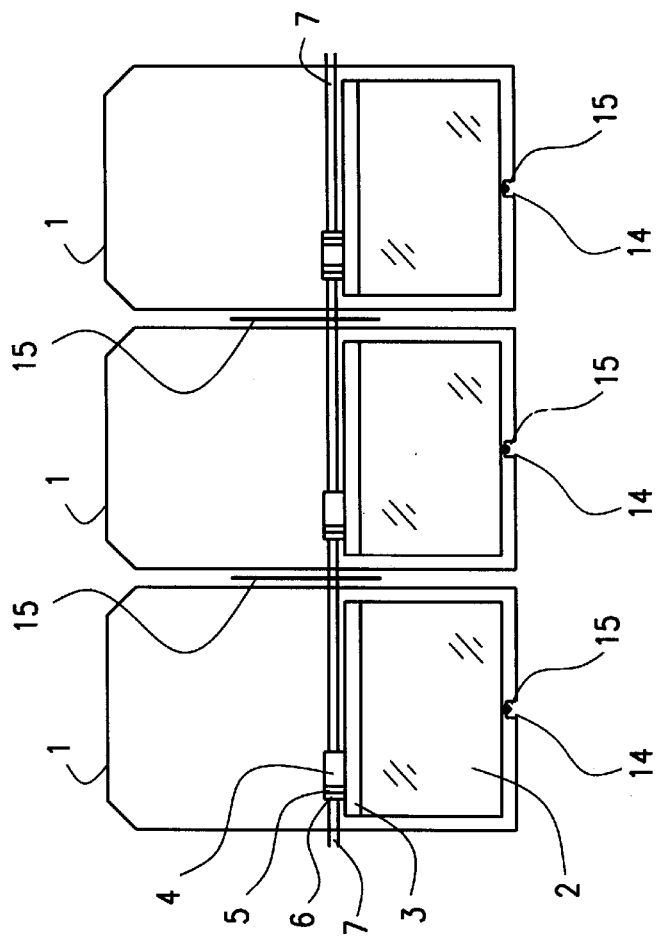

United States Patent
Posnansky

[11] Patent Number: 5,990,414
[45] Date of Patent: Nov. 23, 1999

[54] PHOTOVOLTAIC SOLAR ROOF

[76] Inventor: Mario Posnansky, Melchenbühlweg 18 CH-3006, Bern, Switzerland

[21] Appl. No.: 09/077,174
[22] PCT Filed: Nov. 21, 1996
[86] PCT No.: PCT/CH96/00411
  § 371 Date: Sep. 15, 1998
  § 102(e) Date: Sep. 15, 1998
[87] PCT Pub. No.: WO98/13883
  PCT Pub. Date: Apr. 2, 1998

[30] Foreign Application Priority Data

Sep. 23, 1996 [CH] Switzerland ............................. 2318/96

[51] Int. Cl.$^6$ ................................................... H01L 25/00
[52] U.S. Cl. .......................... 136/244; 136/291; 136/245; 52/173.3
[58] Field of Search ..................................... 136/244, 245, 136/291; 52/173.3

[56] References Cited

U.S. PATENT DOCUMENTS 4,040,867  8/1977  Forestieri et al. ...................... 136/244
5,232,518  8/1993  Nath et al. ............................... 136/244

*Primary Examiner*—Mark Chapman
*Attorney, Agent, or Firm*—Jenkens & Gilchrist, PC

[57] ABSTRACT

This invention concerns a solar roof consisting of unmodified mass-produced roofing elements (1), for example of fiber cement, upon which solar cells (2) which have also been mass produced have been made fast using adhesive or clamps. Each solar cell (2) has a border element (3) on its upper edge upon which a connecting terminal (4) is placed. This connecting terminal (4) has at least one receptacle (5) into which can be inserted an asymmetrically formed plug (6) at the end of a cable (7). All of the named elements (1 to 7) rest on the roofing elements (1) so that no ducts of any kind need to be provided through the roofing elements (1), for example, a longer cable (17) leads from the final roofing element (1) of a row under the next higher overlaying roofing element and under the roof to a converter or direct consumer. The switch type (series or parallel) of the individual solar cells (2) is established by the wiring in the connecting terminal (4). The roof can be laid by a roofer with no electrotechnical expertise.

16 Claims, 4 Drawing Sheets

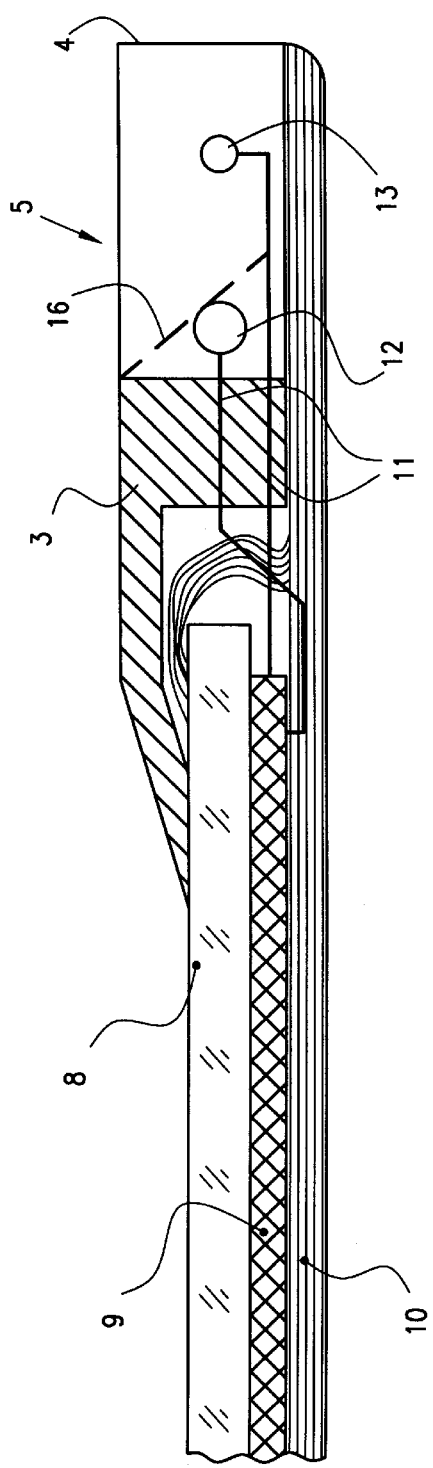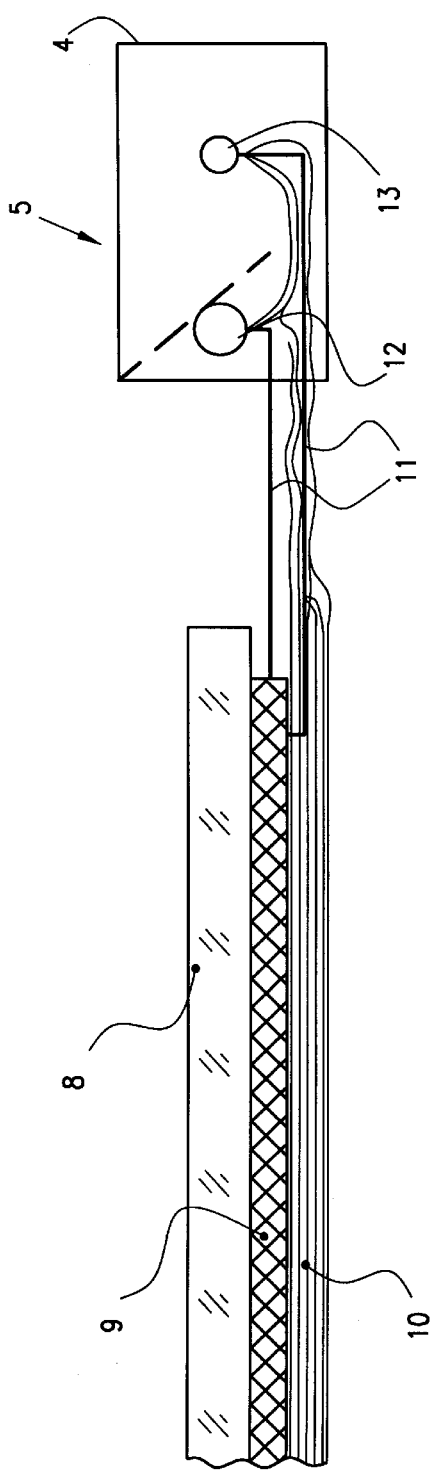
FIG. 2
FIG. 3

PHOTOVOLTAIC SOLAR ROOF

The present invention relates to an arrangement for the photovoltaic generation of current on or by means of roofs and facades in accordance with the preamble to patent claim 1. Many such arrangements and elements are known.

Their provenance is based on the idea, that it is more expedient to employ surfaces which are already covered and shaded for the installation of photovoltaic elements, than to cover new surfaces in the style of a solar farm. Thus, for instance, ca. 10% of the existing roofs and facades are already sufficient for the generation of a supply contribution of ca. 20% of the entire supply for an industrialized country.

The state of the technology considered here is described especially in the specifications DE 44 38 858 (D1), FR 2 354 430 (D2), JP 07 02 6664 (D3), JP 07 062 802 (D4), JP 05 05 2004 (D5), DE 42 27 929 (D6) and DE 41 39 753 (D7).

D7 gives only a general note on a method of procedure, but no concrete instruction on technical handling. D6 describes a roofing tile, which is suitable for accepting solar cells, which, however—apart from the actual work of laying—still requires a large outlay for the production of the necessary connections. Similarly the solar roof system according to D1 requires a large expense for the creation of the necessary roof tiles or slates required. The specifications D2 to D5 all describe a special production of the roofing element to be employed, amongst which is understood a ceramic roof tile, or also flat roofing elements made of ceramics, glass, fiber cement or bituminous bound materials; this latter listing is not all-inclusive, but should be understood in the sense of an example.

Special production for limited application is as a rule expensive and presents a substantial hindrance to the application purpose being examined here.

The electrical connections and links in the previously mentioned photovoltaic roofing elements are taken either directly or with the aid of special borings or openings in the roofing elements into the inner parts of the roof or effected and undertaken by contact strips—and/or rails. This is in the striving to have the electrical elements within the weatherproof interior of the roof. Borings or other openings in roofing elements are on the one hand again expensive special productions, and on the other hand potentially not basically watertight. Pressure contacts to the roofing elements are similarly expensive and labor intensive special productions and very liable to corrosion.

Seen overall, the solutions mentioned here all suffer from the disadvantage that expensive, labor intensive special production is necessary, which significantly exceeds the normal scope of work of a producer of roofing elements and in which when considering the laying of a roof, the not unusual event may not be taken into account that individual roofing elements have to be replaced, whether this be because the roofing element itself or the solar cells upon it have become damaged. None of the known solutions has so far led to practical fabrication and introduction of cost-effective devices to the market.

The aim, which the photovoltaic solar roof or solar facade according to the invention has to fulfill lies in reducing the price for a photovoltaic generated kilowatt/hour by rejecting any special production of roofing and facade elements by the cost-neutral transfer of the intrinsic photovoltaic price factors of installation, fastening and retention, stability requirements onto mass produced roofing elements and by simple, reliable electrical connections, by a value, where the solar energy, considered in an overall way costs comparably as much as thermally or hydraulically generated energy from newly installed power stations. Furthermore the laying and repair of a solar roof or solar facade according to the invention can be undertaken, without the expenditure of further cost, by the normal roofing worker or facade builder.

This aim is addressed in the characterizing part of claim 1 with respect to its essential characteristics, in claims 2 to 15 with respect to further advantageous developments.

Figure 1:
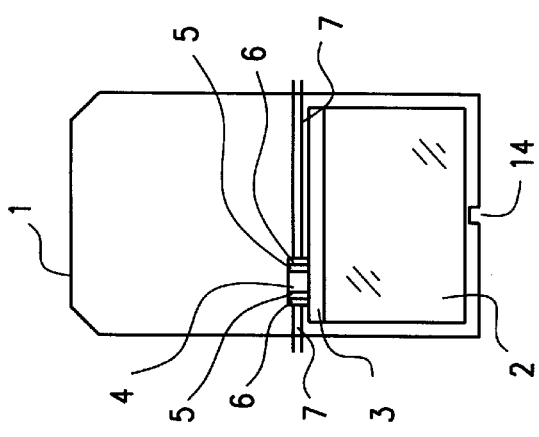
Figure 10:
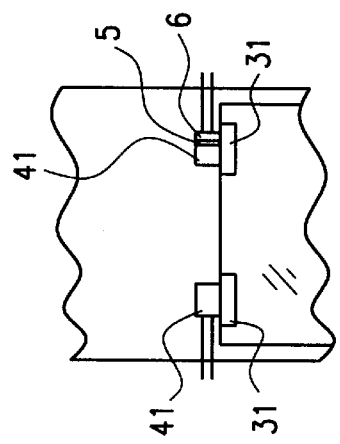
Figure 4:
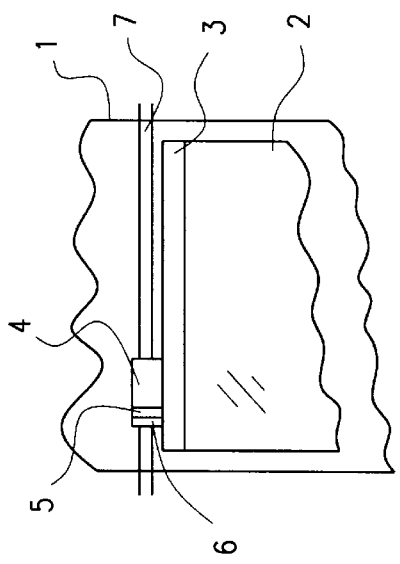
Figure 7:
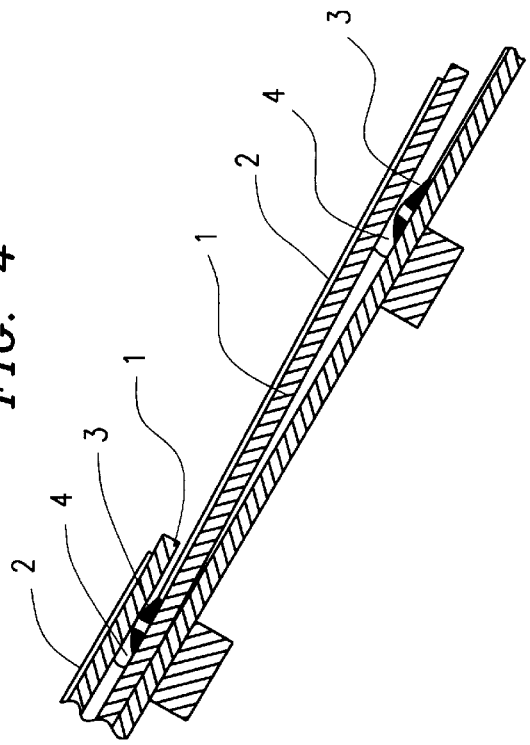
Figure 8:
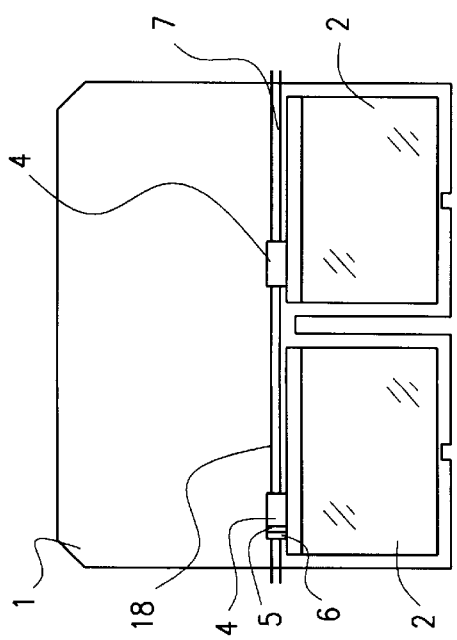
Figure 9:
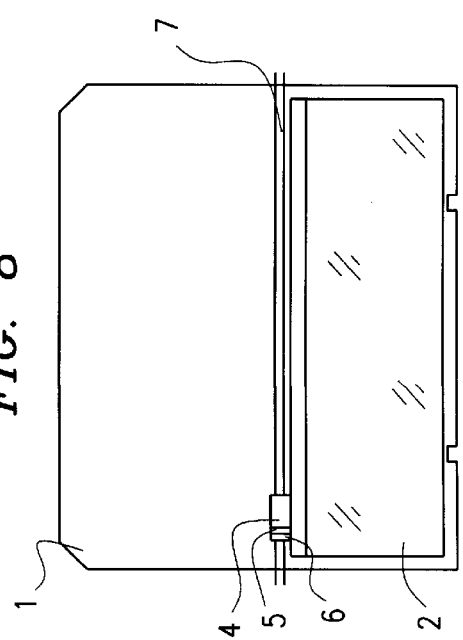
Figure 6:
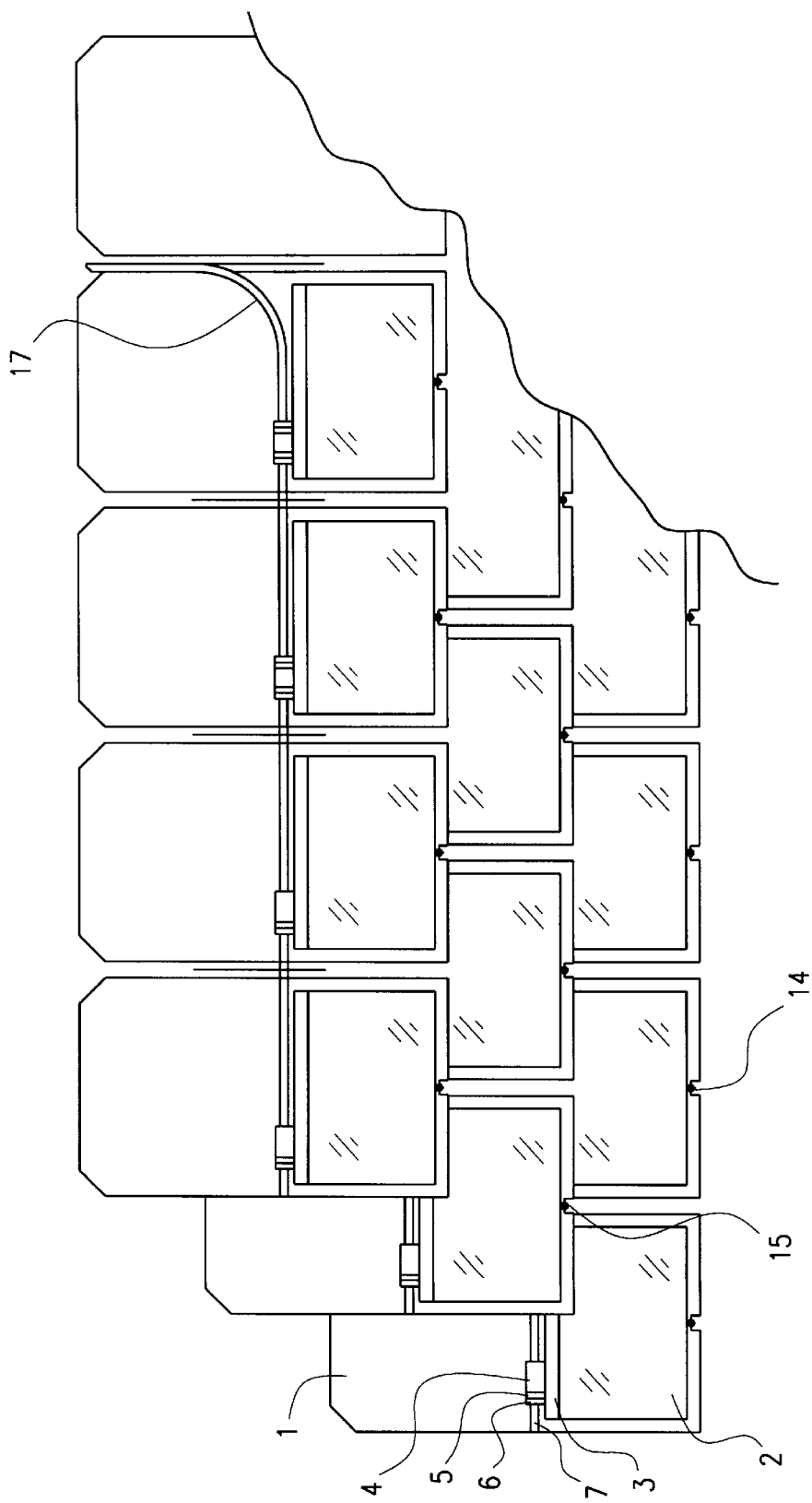

The concepts of the invention are described in detail using the drawings. Shown are:

FIG. 1 a first example of construction of a solar roofing element,

FIG. 2 a longitudinal section through a first solar cell according to the invention, FIG. 3 a longitudinal section through a second solar cell according to the invention, FIG. 4 a modification of the example of construction from FIG. 1, FIG. 5 several solar roofing elements in combination, FIG. 6 a part of a solar roof, FIG. 7 a partial section through a solar roof, FIG. 8 a second example of construction of a solar roofing element, FIG. 9 a third example of construction of a solar roofing element, FIG. 10 a modification with regard to FIG. 1

FIG. 1 shows a plan view of a first example of construction of an element of the arrangement according to the invention. Reference 1 designates a roofing element which can be obtained in various dimensions in the trade, made for example from fiber cement. Throughout the whole of the following description the designation roofing element always also means a facade element. Roofing and facade elements can be similarly or identically constructed and/or formed; often only the fastening technique is different, which is because the direction of the static forces is different and the damming and capillary water relationships are different. The lower part of the roofing element carries a photovoltaic solar cell, for instance made of monocrystalline, polycrystalline or amorphous silicon. The construction of the solar cell 2 itself is shown in FIG. 2. The solar cell 2 is integrated into the roofing element 1. In construction it is fastened by gluing or using clamps (not shown in FIG. 1), which are attached to the roofing element 1. This the roofing element 1 and the solar cell 2 form a static unit in the sense that the stability function is essentially taken over by the roofing element. The solar cell 2 has, for instance, a finishing strip 3 on its upper edge, which represents the mechanical structure for the transfer of the internal to the external electrical connections. A connecting terminal 4 is fastened on the upper edge of the finishing strip 3. This is—for reasons to be described later—preferably offset eccentrically, for instance to the left of the center line of the solar cell 2. It has, as in the example of construction according to FIG. 1, a socket 5 to the left and right, whereby each is set up to accept a plug 6, which for its part terminates in a two core cable 7. The type of circuit—series or parallel connection—of the individual solar cells 2 is established by the internal wiring of the connecting terminal 4. The roofing element 1 has for example a cut out 14 on its upper edge for a hook (not shown), which is for its part fastened into the battens, on which the roofing elements 1 lie and are fastened.

A modification drawn in FIG. 4 shows a connecting terminal 4 with only one socket 5. The cable 7 leading to the adjacent solar cell is fastened directly into the connecting terminal 4 without a plug connection. The concept of plug and socket is basically here extended such that the connection is easily created, but can only be broken again by operation of an element, which for instance is attached to the socket 5. The concept of spring loaded connection is thus included in the sense of the invention, similarly to plug and socket.

FIG. 2 is the representation of a longitudinal section through the upper part of a first example of construction of a solar cell 2. A thin transparent glass plate 8—or a similar of glass ceramic—is the carrier of a silicon semiconductor assembly designated with the reference 9. On the rear side, the semiconductor assembly 9 is covered by a multilayer laminate foil 10, which includes at least one aluminum or glass foil as a moisture excluder, against all sorts of vapor. This laminated foil can be applied by gluing, welding, full-fusion welding or a similar process. The semiconductor assembly 9 is provided with contacts in a basically known manner and is taken via the current conductor 11 to two receptacles 12, 13 of the socket 5, whereby the question of the type of circuit is not discussed here. The coating with the laminate foil extends as far as under the connecting terminal 4, so that the element is completely flat on the under side, which also includes the connecting terminal 4. The two receptacles 12, 13 are asymmetrically positioned in the assembly drawing with the corresponding connector 6; this ensures that the connection together of individual solar cells 2 can be undertaken only in the intended manner. The asymmetry of the receptacles 12, 13 can be effected by different sizes or shapes, provided only that incorrect mating is thereby prevented by a suitable chicane. At the upper end—to the right in the drawing—of the solar cell 2, the laminated foil 10 grips around the glass plate 8; the finishing strip 3 is applied tight against the laminated foil 10 and the glass plate 8.

In a second example of construction of a solar cell according to FIG. 3 the connecting terminal 4, together with the socket 5 is assembled with the socket 5 flying. The finishing strip 3 is here dispensed with. The covering by the laminate foil 10 at the same time assumes the function of strain relief for the current conductor 11, which both in the example of construction according to FIG. 2 as well as shown here is constructed flexibly.

FIG. 5 shows several roofing elements 1 with solar cells 2 adjacent to each other and thus the construction of mutual electrical connection by means of plugs 6 and cables 7. The manner of laying the roofing elements 1 is carried out fully conventionally; between two roofing elements there is always a hook 15 for the next layer of roofing elements 1 above; the hooks 15 each engage in the cut outs 14. When a row of roofing elements 1 or a part thereof is laid—or indeed during the laying operation—the plug 6 from the roof tile of the (here) left hand side roofing element 1 is plugged into the socket 5 of the connection terminal 4 of the (here) right hand side roofing element 1. Installation knowledge is not necessary for this.

In FIG. 6 a part of a roof covered with the roofing elements according to the invention is shown. An upper row of roofing elements 1 covers in each case the finishing strips 3 of the row lying beneath it. The asymmetrical position of the connecting terminal 4 moves this away from the direct influence of rainwater, which penetrates into the intervening space between two adjacent roofing elements 1. The finishing strips 3 are—as indicated by a dashed line 16 in FIG. 2—beveled off upwards, so that they are run over by rainwater. The connecting terminals are obviously fabricated watertight.

On the right hand edge of FIG. 6 it is shown how the connecting cable of the last roofing element 1, indicated by the reference 17, which is equipped with a solar cell 2, is led upwards in the space between two roofing elements and under the roof. An additional boring in the roofing elements is thus unnecessary. Under the roofing the cables 17 are assembled according to the intended circuit and taken to one or more inverters, to a battery or directly to a load.

FIG. 7 shows the situation as in FIG. 6, in longitudinal section. Technical details of a purely roofing nature, because they are the known state of the art, are omitted here or shown in reduced detail.

What is shown here for roofing elements applies in analog fashion also for facade elements. Facade elements, for instance made of fiber cement, are often of a larger size than roofing elements, as shown in FIGS. 8 and 9. This requirement can be met in that several solar cells 2 as shown in the previous Figures for roofing elements can be connected together (see FIG. 8) or that they are manufactured similarly to a larger size (see FIG. 7). The fastening means for facade elements are by and large similar to those for roofing elements; the laying technique is also similar in principle.

The roofing element 1 according to FIG. 8 has two solar cells 2 of the construction described. Although each finishing strip 3 also has a connecting terminal 4, however only the left hand one has a socket 5. The two connecting terminals are joined to each other by a fixed mounted cable 18. In a modification of the example shown the right hand connecting terminal also has a socket 5; the associated cable 7 then has a plug 6 at both ends.

A cladding element 1 of larger format is shown in FIG. 9, which carries a correspondingly larger solar cell 2; the connections are constructed as described against FIGS. 1, 4, 5. FIG. 10 shows a modification in construction of FIG. 1. Here the finishing strip 3 is reduced to two short finishing strips 31. Each of these terminating elements carries a connection terminal 41. The type of connection to the adjacent solar cells 2 is effected either using a cable 7 in each case, which can be constructed as pluggable on one or both ends. In FIG. 10 the right hand connection terminal 41 has a socket 5 with a plug 6, the left hand one is connected directly with a cable 7.

The advantages and characteristics of the solar roof according to the invention comprise the following points:

The roofing element itself is essentially an unchanged mass product, which can be favorably obtained in different forms, sizes, materials and colors.

Fastening elements are not a part of the solar cells but are undertaken by the conventional roofing element.

Static stability is not the responsibility of the solar cells but of the conventional roofing elements, i.e. the solar cell is thin walled and has a minimum material cost, such that mechanical loads of all sorts can be accepted by the roofing element.

The solar cells foreseen can be created in a few conventional dimensions as a mass product.

The solar cells are put together with the roofing elements as a mass product.

The solar roofing element produced in this way will be laid by roofing tradesmen using their own trade knowledge and rules; additionally, there is only the plugging together of the individual electrical connections, for which no tools of any sort or special knowledge are required.

The electrical connections of each individual solar roofing element are on the roofing element itself; lead-throughs are not intended. Only the connection to the load (inverter, battery, direct load) leads to the inside; as a rule a connection per row of roofing or facade elements is foreseen. The connection can be made without a boring to the solar roofing elements, by leading a longer cable upwards between the roofing elements.

The cabling, plug connections and the electrical wires lie protected underneath the overlapping roofing elements lying above them.

In this way the replacement of individual roofing or facade elements is easily possible, since no electrical connectors lying beneath the roof skin have to be broken and freshly installed.

The whole of the structural costs as well as the arrangements for stability and retention are borne by the roof or facade—which have to be met in any case, which in comparison with solar farm type arrangements or photovoltaic installations mounted on or in contact with the roof weighs extraordinarily in the balance as a cost reduction.

With the present invention possibility of reduction in the prime cost of a photovoltaic system are very largely realized by the simultaneous application of roofing and facade elements and thus for the first time the possibility is obtained of generating cost-effective and economic solar current from suitable full production manufacture. This substantial cost reduction results from the arrangement according to the invention by largely eliminating all additional costs for installation and retaining structures and from assembly and installation costs.

I claim:

1. A solar roof facade comprising a plurality of overlapping roofing elements wherein each of said plurality of roofing elements comprises:
   a roofing element portion having an upper portion and a lower portion;
   a photovoltaic solar cell assembly positioned on top of said lower portion, said photovoltaic solar cell assembly comprising a transparent cover positioned on top of a semiconductor assembly along with a waterproofing/vapor proofing layer laminated to the underneath of said semiconductor assembly;
   a current conductor connected to said photovoltaic solar cell assembly; and
   a connecting terminal, connected to said current conductor, positioned in an a location that is offset with respect to a center vertical line of said roofing element and on said upper portion of said roofing element portion, said connecting terminal being for electrically connecting said roofing element to at least another roofing element.

2. The solar roof or facade of claim 1, wherein each of said plurality of roofing elements further comprises a finishing strip positioned adjacent to said photovoltaic solar cell assembly in a horizontal fashion with respect to said roofing element portion, said finishing strip serves as a cover for said connecting terminal.

3. The solar roof or facade of claim 1, wherein said lower portion is positioned on top of an upper portion of another roofing element such that said plurality of roofing elements are overlapped in a manner similar to a shingle roof, said connecting portion being underneath an overlapped lower portion of another roofing element.

4. A solar roofing shingle comprising:
   a roofing element having an upper portion and a lower portion;
   said lower portion of said roofing element comprises:
      a waterproofing layer;
      a semiconductor layer comprising at least one photovoltaic solar cell on top of said waterproofing layer;
      a transparent layer on top of said semiconductor layer;
   said upper portion of said roofing element comprising:
      a conducting terminal for conducting electricity between said solar roofing shingle at least a second solar roofing shingle, said conducting terminal comprising a connector that is positioned away from the vertical center and the edge of said roofing element.

5. The solar roofing shingle of claim 4, further comprising a finishing strip for separating said upper portion from said lower portion, said conducting terminal positioned adjacent to said finishing strip.

6. The solar roofing shingle of claim 4, wherein said connector is used to electrically connect said solar roofing shingle with said at least second solar roofing shingle.

7. The solar roofing shingle of claim 4, wherein said conducting terminal is electrically connected to said semiconductor layer.

8. The solar roofing shingle of claim 4, wherein said waterproofing layer comprises at least one layer of a laminate foil.

9. A solar energy generating roofing shingle comprising:
   a roofing shingle element having an upper and lower portion;
   a photovoltaic solar cell assembly attached to the surface of the lower portion of said roofing shingle;
   a connector positioned on the upper portion of said roofing shingle, said connector being electrically connected to said photovoltaic solar cell assembly and being for connecting adjacent solar energy generating roofing shingles electrically together, said connector being located away from the vertical center line and the edges of said shingle.

10. The solar energy generating roofing shingle of claim 9, wherein said photovoltaic solar cell assembly includes a plurality of photovoltaic solar cells with a transparent covering on top of said plurality of photovoltaic solar cells.

11. The solar energy generating roofing shingle of claim 9, further comprising a finishing strip that covers a horizontal portion of said roofing shingle element between said upper and lower portions of said roofing shingle element.

12. The solar energy generating roofing shingle of claim 9, further comprising a waterproofing laminate between said photovoltaic solar cell assembly and said lower portion of said roofing shingle element.

13. The solar energy generating roofing shingle of claim 9, further comprising a vapor proofing laminate between said photovoltaic solar cell assembly and said lower portion of said roofing shingle element.

14. The solar energy generating roofing shingle of claim 9, wherein said connector is positioned such that it will not be located in an intervening space between over lapping roofing shingle elements and will be located under said overlapping roofing shingle elements when said solar energy generating roofing shingle is incorporated into a roof or facade.

15. The solar energy generating roofing shingle of claim 9, wherein said roofing shingle element comprises fiber cement.

16. The solar energy generating roofing shingle of claim 9, wherein said solar energy generating roofing shingle can be connected to a plurality of other solar energy generating roofing shingles in at least one of a parallel and a series circuit layout.

* * * * *

UNITED STATES PATENT AND TRADEMARK OFFICE
CERTIFICATE OF CORRECTION

PATENT NO. : 5,990,414  
DATED : November 23, 1999  
INVENTOR(S) : Mario Posnansky It is certified that error appears in the above-identified patent and that said Letters Patent is hereby corrected as shown below:

Please amend the cover page of the patent as follows:

References missing that were cited in the Information Disclosure Statement filed September 15, 1998 and approved by the Examiner in Office Action dated May, 12, 1999 in Paper No. 9:

[56] References Cited: U.S. Patent Documents:
    5,437,735    8/1/95   Younan, et al   136/251

Foreign Patent Documents:

| | | |
|---|---|---|
| DE 4408508 A | 9/21/95 | Germany |
| FR 2 354 430 A | 6/1/78 | France |
| WO 92 16972 A | 10/1/92 | PCT |
| DE 42 27 929A | 3/10/94 | Germany |
| EP 0547 285 A | 6/23/1993 | EPO |

Other Publications:  
International Search Report dated June 2, 1997

UNITED STATES PATENT AND TRADEMARK OFFICE
CERTIFICATE OF CORRECTION

PATENT NO.   : 5,990,414
DATED        : November 23, 1999
INVENTOR(S)  : Mario Posnansky It is certified that error appears in the above-identified patent and that said Letters Patent is hereby corrected as shown below:

<u>Column 5,</u>
Line 32, replace "roof facade" with -- roof of facade --

Signed and Sealed this

Seventh Day of August, 2001

*Attest:*

*Attesting Officer*

NICHOLAS P. GODICI
*Acting Director of the United States Patent and Trademark Office*